United States Patent [19]

Clauberg et al.

[11] Patent Number: 5,463,705
[45] Date of Patent: Oct. 31, 1995

[54] OPTICAL WAVEGUIDE ISOLATION

[75] Inventors: Rolf Clauberg, Gattikon; Christoph Harder, Zurich; Christan Heusch, Adliswil; Heinz Jaeckel, Kilchberg, all of Switzerland

[73] Assignee: International Business Machines Corporation, Armonk, N.Y.

[21] Appl. No.: 288,639

[22] Filed: Aug. 10, 1994

Related U.S. Application Data

[63] Continuation of Ser. No. 126,417, Sep. 27, 1993, abandoned.

[30] Foreign Application Priority Data

Nov. 24, 1992 [EP] European Pat. Off. ............. 92810911

[51] Int. Cl.[6] .................................................. G02B 6/12
[52] U.S. Cl. .................................... 385/14; 385/38; 385/45
[58] Field of Search .............................. 385/14, 15, 45, 385/46, 48, 131, 132, 38

[56] References Cited

U.S. PATENT DOCUMENTS

| | | | |
|---|---|---|---|
| 3,830,555 | 8/1974 | Warner | 350/96 |
| 4,674,827 | 6/1987 | Izutsu et al. | 350/96.12 |
| 4,691,983 | 9/1987 | Koyayashi et al. | 350/96.12 |
| 4,715,680 | 12/1987 | Kawaguchi et al. | 385/45 |
| 4,844,573 | 7/1989 | Gillham et al. | 385/45 |
| 4,846,540 | 7/1989 | Kapon | 350/96.12 |
| 4,860,294 | 8/1989 | Winzer et al. | 385/45 |
| 4,973,119 | 6/1989 | Taki | 350/96.13 |
| 5,127,681 | 6/1992 | Koren et al. | 385/14 |
| 5,214,487 | 5/1993 | Pavlath et al. | 385/14 |

FOREIGN PATENT DOCUMENTS

| | | |
|---|---|---|
| WO88/08148 | 4/1988 | European Pat. Off. . |
| 0363547 | 9/1988 | European Pat. Off. . |
| 0343688 | 5/1989 | European Pat. Off. . |
| 0402556 | 6/1989 | European Pat. Off. . |
| 0397089 | 7/1990 | European Pat. Off. . |
| 0469789A2 | 7/1991 | European Pat. Off. . |
| 0470523A2 | 2/1992 | European Pat. Off. . |
| 0497141A3 | 8/1992 | European Pat. Off. . |
| 0532816A1 | 3/1993 | European Pat. Off. . |
| 2614999 | 5/1987 | France . |
| 59-142504 | 8/1984 | Japan . |
| 59-151102 | 8/1984 | Japan ..................................... 385/45 |
| 61-059421 | 3/1986 | Japan . |
| 61-153603 | 7/1986 | Japan ..................................... 385/45 |
| 63-198005 | 2/1987 | Japan . |
| 62-291604 | 12/1987 | Japan ..................................... 385/45 |
| 3-40480 | 7/1989 | Japan . |
| 2287407 | 11/1990 | Japan . |
| 4293004 | 10/1992 | Japan . |

OTHER PUBLICATIONS

A. R. Clobes, et al., "Single–frequency traveling–wave Nd: YAG laser" Appl. Phys. Lett., V. 21, #6, pp. 265–266, Sep. 1972.

H. Yajima, "Dielectric thin–film optical branching waveguide" Appl. Phys. Lett., V. 22, #12, pp. 647–649, Jun. 1973.

W. K. Burns, et al., "Mode converstion in planar–dielectric separating waveguides" IEEE Jrl. of Quantum Electronics, V. QE–11, #1, pp. 32–39, Jan. 1975.

(List continued on next page.)

Primary Examiner—Akm E. Ullah
Assistant Examiner—John Ngo
Attorney, Agent, or Firm—Charles W. Peterson, Jr.

[57] ABSTRACT

Optical waveguide isolator (121) for monolithic integration with semiconductor light emitting diodes such as Fabry-Perot or ring laser diodes. The present optical isolator (121), with optical input port (95) and output pod (96), comprises a branching waveguide coupler (56). This branching waveguide coupler (56) has a waveguide stem (60) splitted at one end into two waveguide branches (57, 58) such that a light wave fed via said input pod (95) into a first of these branches (58), is guided via the waveguide stem (60) and the output pod (96) out of the device. A light wave fed to the isolator's output pod (96) is guided along the stem (60) and coupled into the second waveguide branch (57).

17 Claims, 10 Drawing Sheets

OTHER PUBLICATIONS

H. Yonezu, et al., "High optical power density emission from a window stripe AlGaAs double–heterostructure laser" Appl. Phys. Lett. 34 (10), pp. 637–639, May 1979.

H. Sasaki, et al., "Normalized power transmission in single mode optical branching waveguides" Electronics Letters, V. 17, #3, pp. 136–138, Feb. 1981.

M. Izutsu, et al., "Operation mechanism of the single–mode optical–waveguide Y junction" Optics Letters, V. 7, #3, pp. 136–138, Mar. 1982.

M. Izutsu, et al., "Optical–waveguide hybrid coupler" Optics Letters, V. 7, #11, pp. 549–551, Nov. 1982.

K. Y. Liou, et al., "Monolithic integrated InGaAsP/InP distributed feedback laser with Y-branching waveguide and a monitoring photodetector grown by metalorganic chemical vapor depostion" Appl. Phys. Lett., V. 54, #2, pp. 114–116, Jan. 1989.

"High performance buried ridge DFB lasers monolithically integrated with butt coupled strip loaded with butt coupled strip loaded passive waveguides for OEIC" Electronics Letters, V. 26, #2, pp. 142–143, Jan. 1990.

P. Vettiger, et al., "Full–wafer technology—A new approach to large–scale laser fabrication and integration" IEEE Jrl. of Quantum Electronics, V. 27, #6, pp. 1319–1331, Jun. 1991.

A. Behfar–Rad, et al., "Etched–facet AlGaAs triangular–shaped ring lasers with output coupling" Appl. Phys. Lett. V. 59, #12, pp. 1395–1397, Sep. 1991.

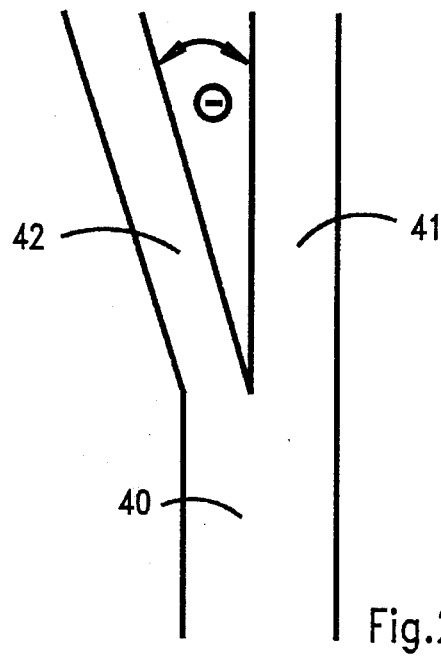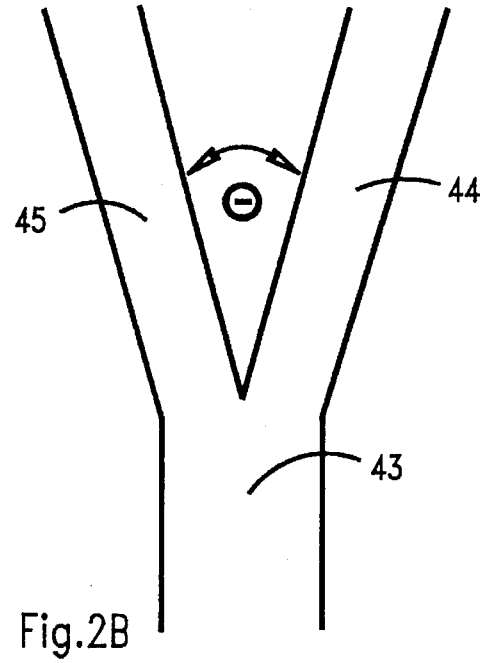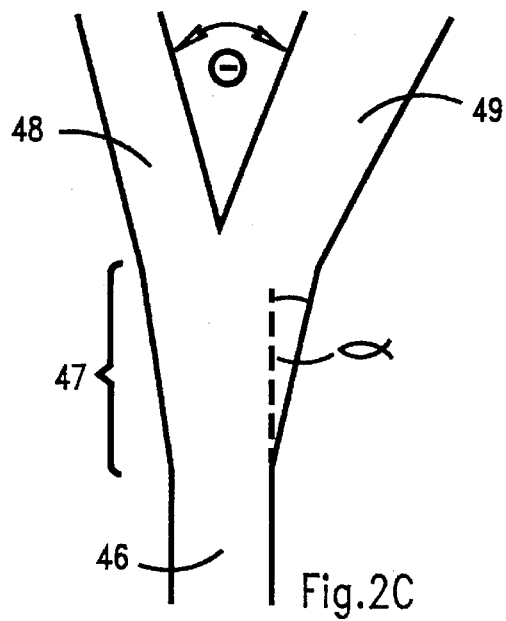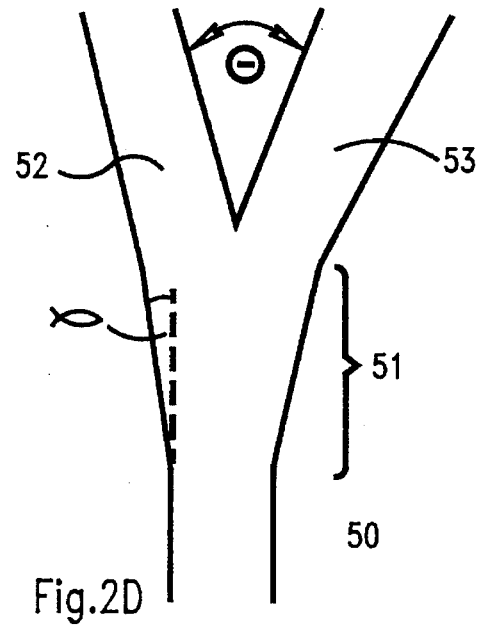

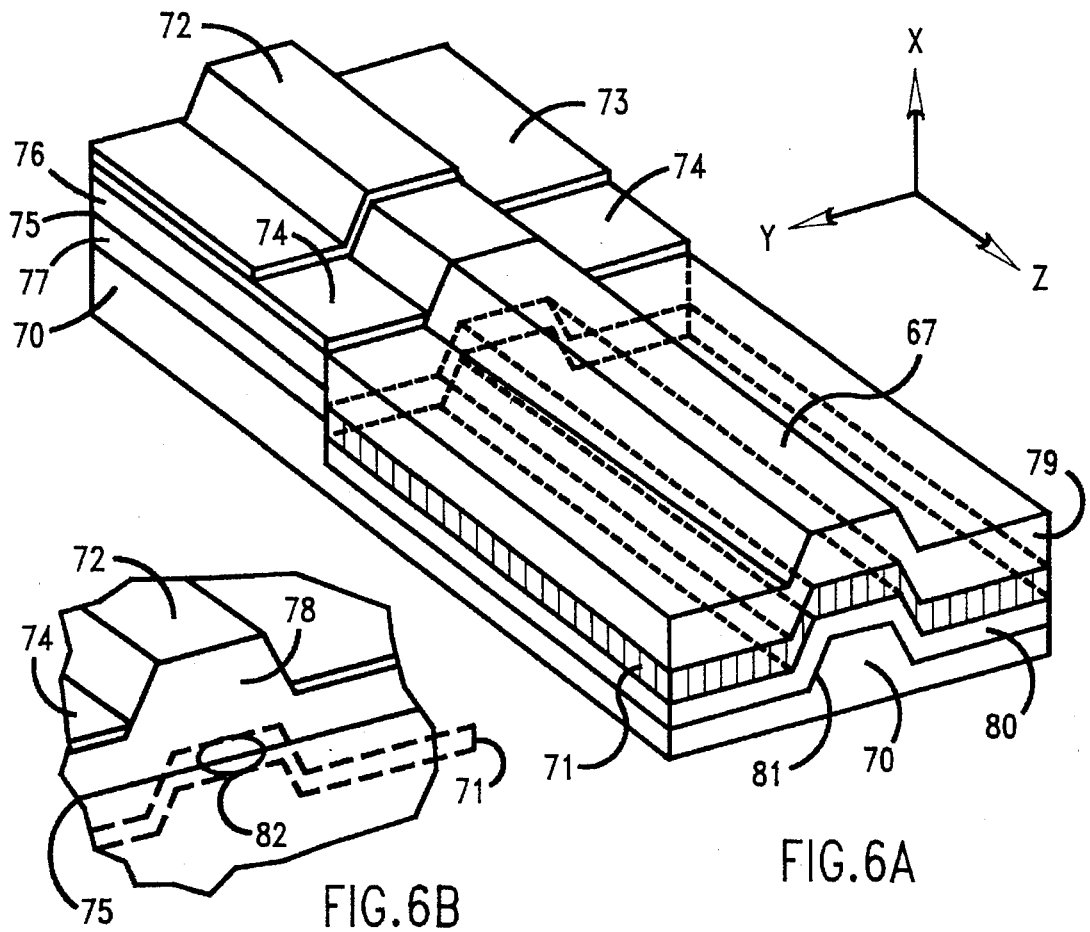
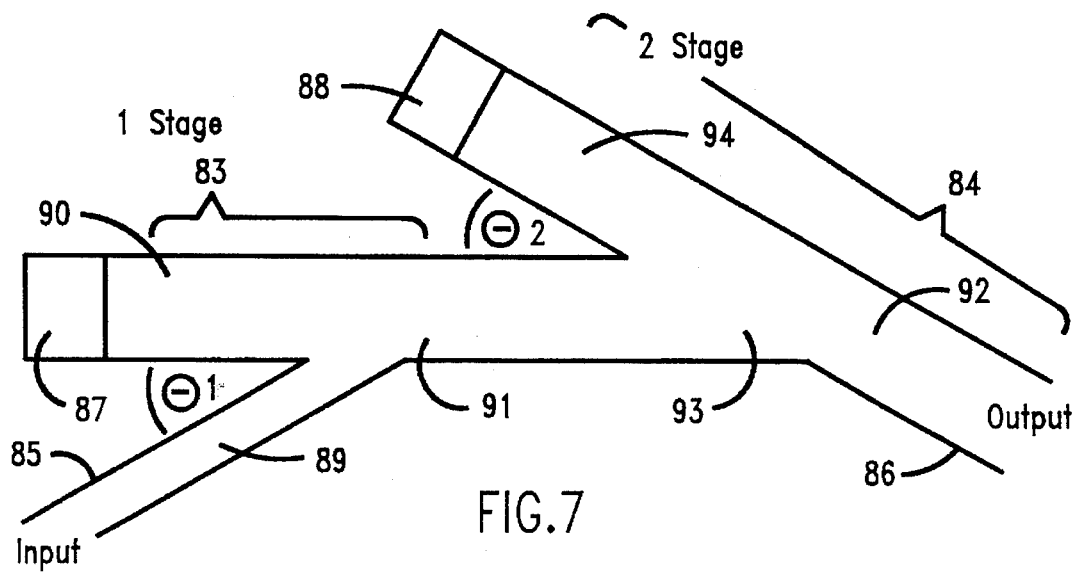

OPTICAL WAVEGUIDE ISOLATION

The application is a continuation of application Ser. No. 08/126,417, filed Sep. 27, 1993, now abandoned.

TECHNICAL FIELD

The invention concerns optical waveguide isolators being monolithically integrable with semiconductor laser diodes and other opto-electronic devices.

BACKGROUND OF THE INVENTION

Optical isolators are typically employed in bulk optical systems to eliminate one of two counter-propagating electro-magnetic light waves. An optical isolator is comparable with a diode having a low electrical resistance between its input pod and output pod and a very high resistance between the output port and input pod. Analogous, a light wave, fed via the optical input pod of an optical isolator to its output pod, is guided with low loss, and a counter-propagating light wave, i.e. a light wave being fed to the isolator's optical output port, is attenuated such that only a small amount thereof leaves the isolator via the input pod. Such an optical isolator has a unidirectional transmittance property, and cuts off most of the light fed back into its output pod.

A conventional optical isolator used in a pumiced laser cavity configuration is disclosed in the article "Single-Frequency Traveling-Wave Nd:YAG Laser", A. R. Clobes et al., Applied Physics Letters, Vol. 21, No. 6, September 1972, pp. 265–266. The bulk optical isolator illustrated and described in this article comprises a Faraday cell rotating the polarization of a light wave, depending on the light wave's propagation direction, when applying a magnetic field to it. In addition, a half-wave plate, being part of the optical isolator, is situated in the light path, such that a light wave passing through said Faraday cell prior to passing through the half-wave plate remains un-attenuated and a counter-propagating light wave is attenuated.

Other optical isolators, based on the same principle of affecting the light wave's polarization and guiding it through a polarization sensitive filter element, are listed below. These optical isolators have the advantage, with regard to electro-optic integration, that they are smaller, and some of them suited for integration into optical waveguides.

U.S. Patent, U.S. Pat. No. 3 830 555 with title "Non-reciprocal Waveguide Mode Conveder";

French Patent, FR-A 2 614 999 with title "Guide d'Onde Optique Bidimensionnel Monomode Ferrimagnétique, son Procédé de Fabrication, et son Utilisation dans un Isolateur Optique Intégré";

European Patent Application, EP-A 0 309 531 with title "Monolithic Monomode Waveguide Isolator and Application to a Semiconductor Laser";

German Patent, GE-A 3 741 455 with title "Optischer Isolator";

European Patent Application, EP-A 0 343 688 with title "Optical Element, Optical Disk and Rotary Encoder with the Optical Element";

European Patent Application, EP-A 0 397 089 with title "Light Isolator of Waveguide Type";

U.S. Patent, U.S. Pat. No. 4,973,119 with title "Optical Waveguide Isolator";

European Patent Application, EP-A 0,170 523 with title "Optical Polarization-State Conveding Apparatus for Use as Isolator, Modulator and the Like".

Most of these isolators, are complex, bulky active elements, employing the magneto-optic effect for rotation of the polarization of an electro-magnetic light wave, thus providing for a nonreciprocal transmittance properly. To affect the light wave's polarization, electro-magnetic materials, e.g. Gadolinium Gallium Garnet (GGG; $Gd_3Ga_5O_{12}$), ferromagnetic garnet or Yttrium Iron Garnet (YIG; $Y_3Fe_5O_{12}$), have to be employed. Additionally, electrodes, for applying an electrical field, have to be incorporated in these isolators.

Some of the disadvantages and problems of the above electro-magnetic optical isolators are discussed in the following. The electro-magnetic materials are hard to integrate with other optical devices. While a film of an electro-magnetic material itself can be grown by Liquid Phase Epitaxy (LPE) or sputtering, a film of suitable quality cannot be grown on a semiconductor substrate since their lattice constants and thermal expansion coefficients differ. Thus, it is difficult to integrate optical isolators, based on the electro-magnetic effect, with other optical devices.

There are magnetic semiconductor materials known in the art, e.g. CdMnTe, allowing the integration on conventional semiconductor substrates. A typical waveguide isolator, consisting of multiple layers of CdMnTe and CdTe grown on top of a semiconductor substrate, is disclosed in Japanese Patent Application JP-A 63 198 005 with title "Waveguide Type Isolator". The employment of magnetic semiconductor materials still results in bulky devices which are not easy to integrate with other devices.

From this point of view, it would be desirable to employ optical isolators, instead of the one's described above, made of semiconductor materials which can easily be grown on top or a substrate, f.e. consisting of semi-insulating GaAs or InP. This would allow a further reduction of size, resulting in higher integration densities, and simpler fabrication. The integration of such an optical isolator in an optical waveguide would be advantageous.

The present optical waveguide isolator employs directional waveguide couplers which are, as such, known in the ad. The smaller the size of these directional couplers is, the better they are suited for monolithic electro-optical integration (EOI).

The most commonly used directional waveguide coupler is hereinafter referred to as branching waveguide coupler. The simplest branching waveguide coupler is an Y-shaped waveguide, i.e. it consists of a waveguide stem at one of its ends being splitted into two branches. Depending on the refractive indices of the stem and each of said branches, their width the branching angle, and the embedding material, the branching waveguide coupler serves as power divider or mode splitter. Exemplary literature, relating to passive branching waveguide couplers, is listed below:

"Mode Conversion in Planar-Dielectric Separating Waveguides", W. K. Burns et al., IEEE Journal of Quantum Electronics, Vol. QE-11, No. 1, January 1975, pp. 32–39:

"Normalised Power Transmission in Single Mode Optical Branching Waveguides", H. Sasaki et al., Electronics Letters, Vol. 17, No. 3, February 1981, pp. 136–138;

"Operation Mechanism of the Single-Mode Optical-Waveguide Y Junction", M. Izutsu et al., Optics Letters, Vol. 7, No. 3, March 1982, pp. 136–138;

"Optical-Waveguide Hybrid Coupler", M. Izutsu et al., Optics Letters, Vol. 7, No. 11, November 1982, pp. 549–551:

U.S. Patent, U.S. Pat. No. 4,674,827 with title "Slab Type

Optical Device";

U.S. Patent, U.S. Pat. No. 4,846,540 with title "Optical Waveguide Junction";

Most of these articles and patents relate to waveguide branches made of LiNbO$_3$ or glass, only some of them mentioning semiconducting materials, such as GaAs, to be used. An important progress has been made towards waveguides consisting of semiconducting materials and being integrable on conventional semiconductor substrates, as described in the following section.

Examples for the monolithic integration of branching waveguide couplers and laser diodes are given in:

"Monolithic Integrated InGaAsP/InP Distributed Feedback Laser with Y-Branching Waveguide and a Monitoring Photodetector Grown by Metalorganic Chemical Vapor Deposition", K.-Y. Lieu et al., Applied Physics Letters, Vol. 54, No. 2, January 1989, pp. 114–116;

European Patent Application. EP-A 0 469 789 with title "Optical Branching Waveguide".

OBJECTS OF THE INVENTION

It is an object of the present invention to provide for an optical waveguide isolator efficiently attenuating a first light wave and transmitting a counter-propagating second light wave with much less attenuation.

It is another object of the present invention to provide for a small, simple and reliable optical waveguide isolator.

It is another object of the present invention to provide for an optical waveguide isolator which can be monolithically integrated with opto-electronic devices, such as semiconductor diodes.

It is a further object of the present invention to provide for a ring laser structure with integrated optical waveguide isolator which attenuates of one of the two counter-circulating light waves in the ring laser's cavity without attenuating the counter-propagating light wave.

It is another object of the present invention to provide for a ring laser structure with improved. i.e. reduced spectral width, light output.

It is another object of the present invention to provide for a Fabry-Perot laser diode structure with integrated optical waveguide isolator which allows an attenuation of light waves coupled into the structure.

SUMMARY OF THE INVENTION

This has been accomplished by providing for an optical waveguide isolator having an optical input pod and an optical output port, and comprising an Y-shaped branching waveguide coupler, the optical output pod being situated at the lower end of the waveguide stem of the branching waveguide coupler, and the input pod being linked to the end of one of the branching waveguide's branches. In addition, the inventive optical waveguide isolator comprises absorber means coupled to, or being pad of the second waveguide branch, to eliminate light waves coupled into it.

DESCRIPTION OF THE DRAWINGS

The invention is described in detail below with reference to the following drawings, which are schematic and not drawn to scale, while more particularly the dimensions of some pads are exaggerated for the sake of clarity.

A general channel waveguide:
B buried channel waveguide
C buried heterojunction waveguide:
D embedded strip waveguide:
E rib waveguide:
F ridge waveguide:
G ridge waveguide:
H raised strip waveguide.

FIGS. 2 shows top views of branching waveguide couplers known in the art:

A asymmetric branching waveguide coupler;

B symmetric branching waveguide coupler;

C asymmetric branching waveguide coupler with tapered section and branches of different width:

D symmetric branching waveguide coupler with tapered section.

Figure 3:
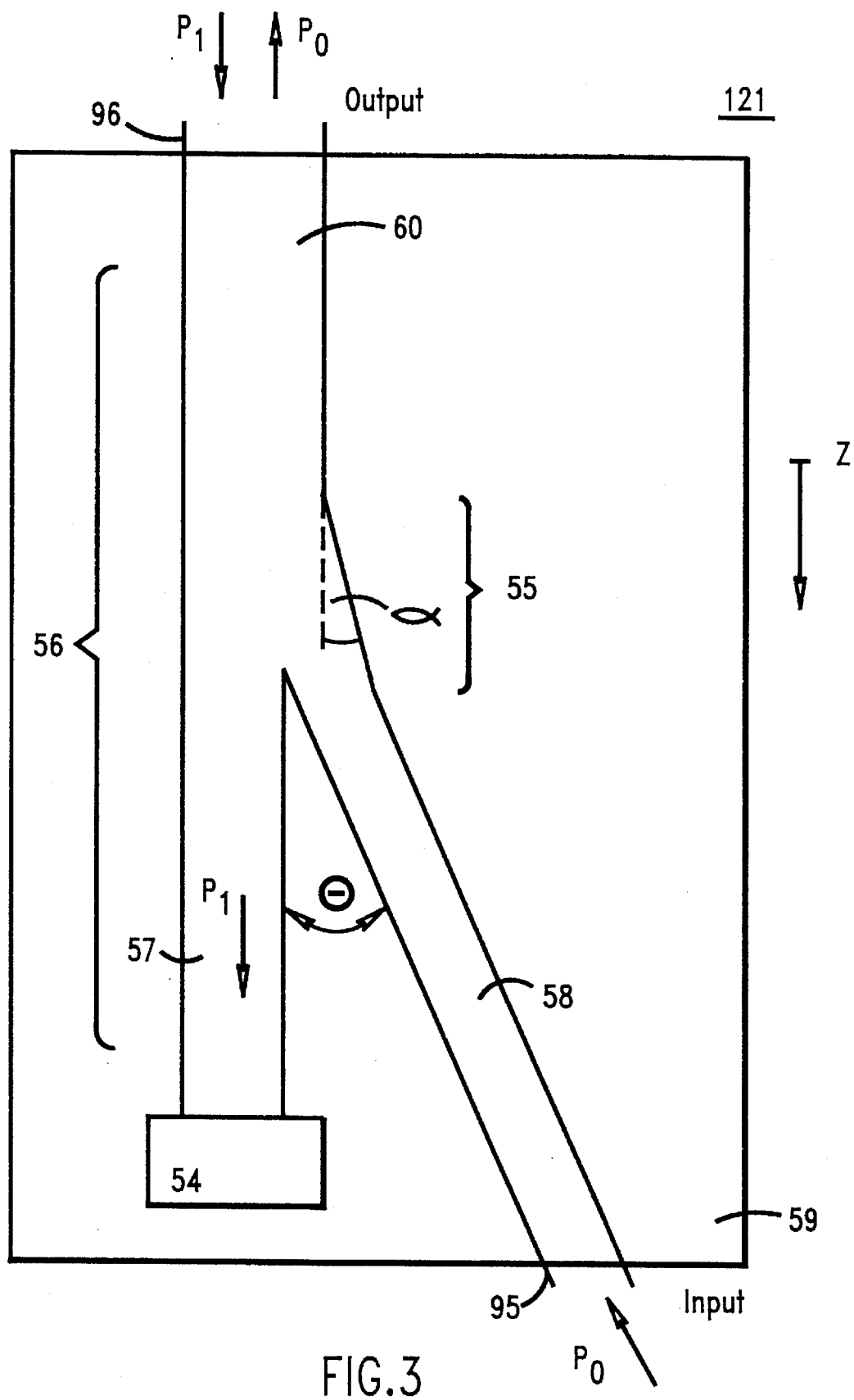

FIG. 3 shows a schematic top view of an optical waveguide isolator in accordance with the first embodiment of the present invention.

Figure 4:
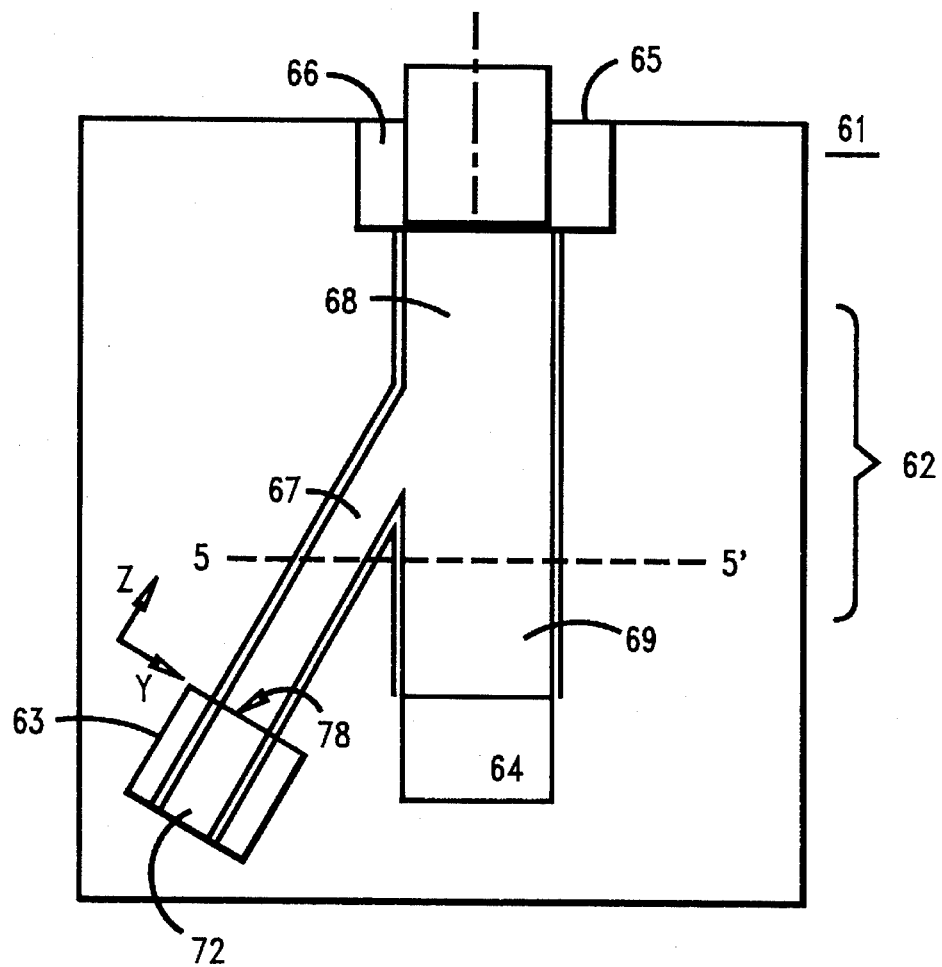

FIG. 4 shows a schematic top view of an opto-electronic integrated circuit, comprising an optical waveguide isolator being monolithically integrated on a substrate with a ridge waveguide laser diode.

Figure 5:
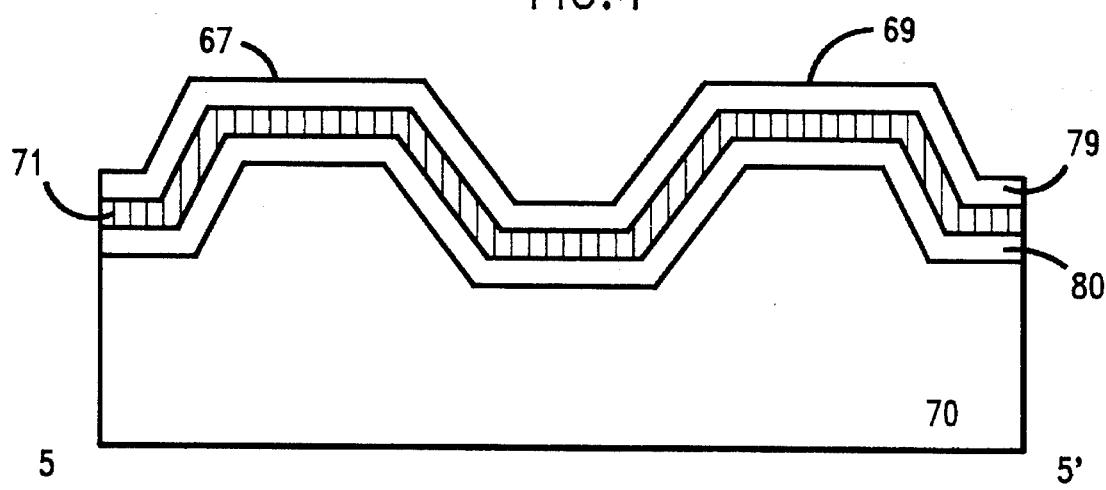

FIG. 5 shows a schematic, magnified cross sectional sketch of the branching waveguide coupler of FIG. 4, parallel to A—A'.

FIGS. 6 shows a perspective view of the ridge waveguide laser diode coupled to the ridge waveguide branch of FIG. 4:

A shows the alignment of said laser- diode to said waveguide;

B shows the light emitting facet of said laser diode.

FIG. 7 shows a top view of a two-stage multimode optical waveguide isolator in accordance with the third embodiment of the present invention.

Figure 8:
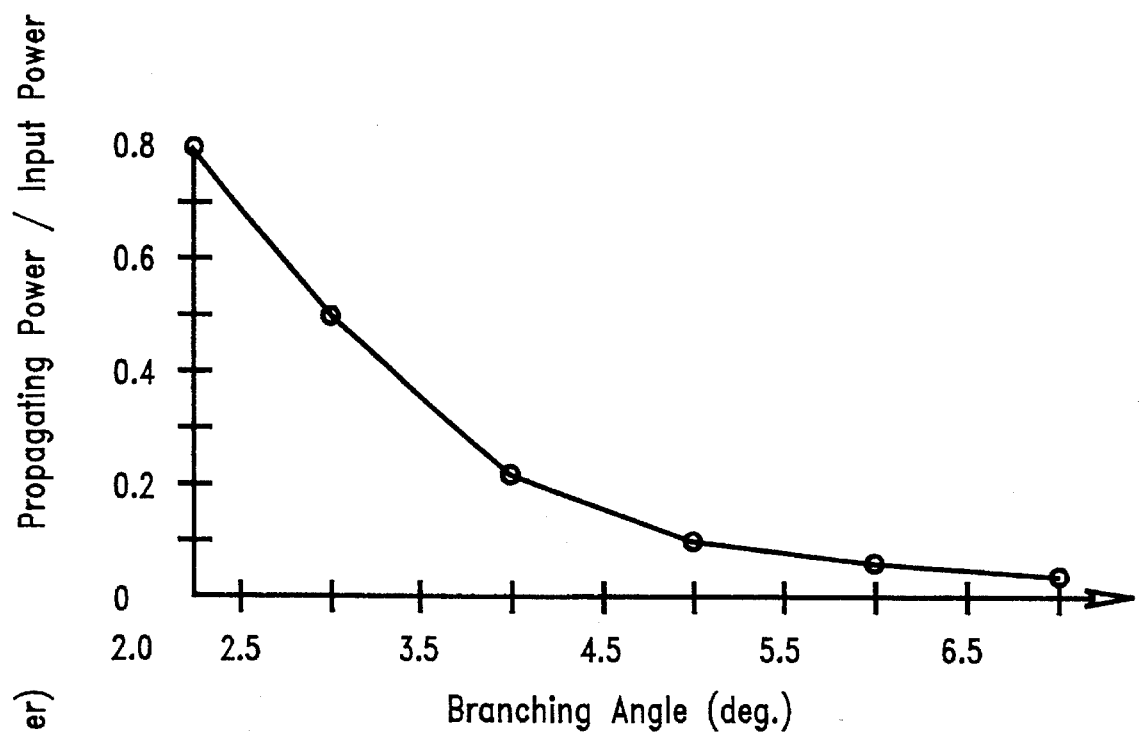

FIG. 8 shows the forward transmitted power versus branching angle ($\theta_1=\theta_2$) of the two-stage optical isolator of FIG. 7.

Figure 9:
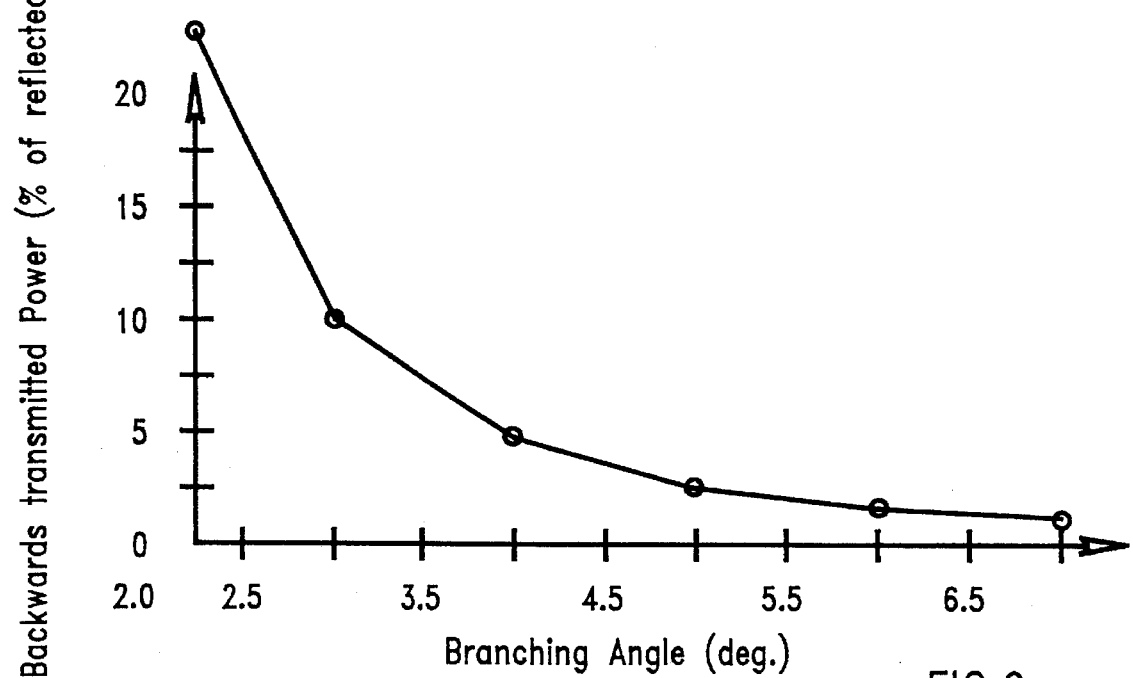

FIG. 9 shows the backward transmitted power versus branching angle ($\theta_1=\theta_2$) of the two-stage optical isolator of FIG. 7.

Figure 10:
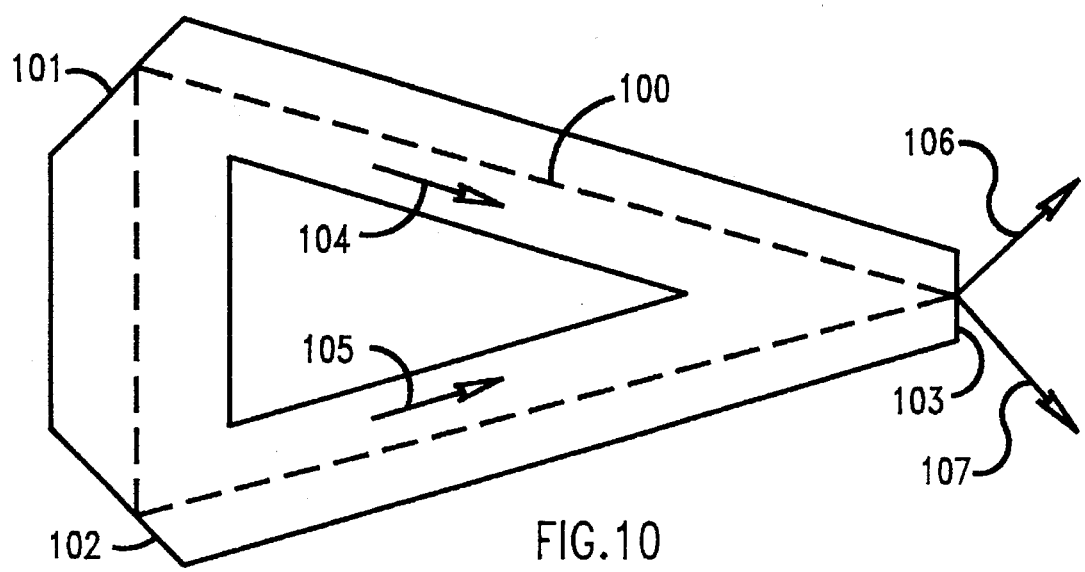

FIG. 10 shows a top view of a ring laser diode with triangular shaped waveguide (Prior Art).

Figure 11:
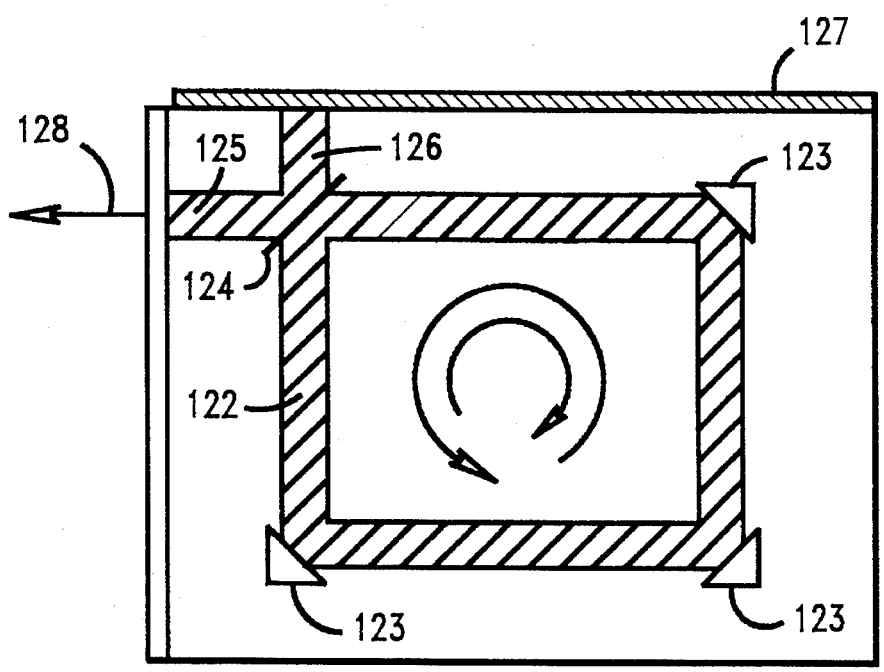

FIG. 11 shows a top view of a ring laser diode with rectangular shaped waveguide, a mirror inserted into the waveguide cavity providing for an improved light extraction efficiency (Prior Art).

Figure 12:
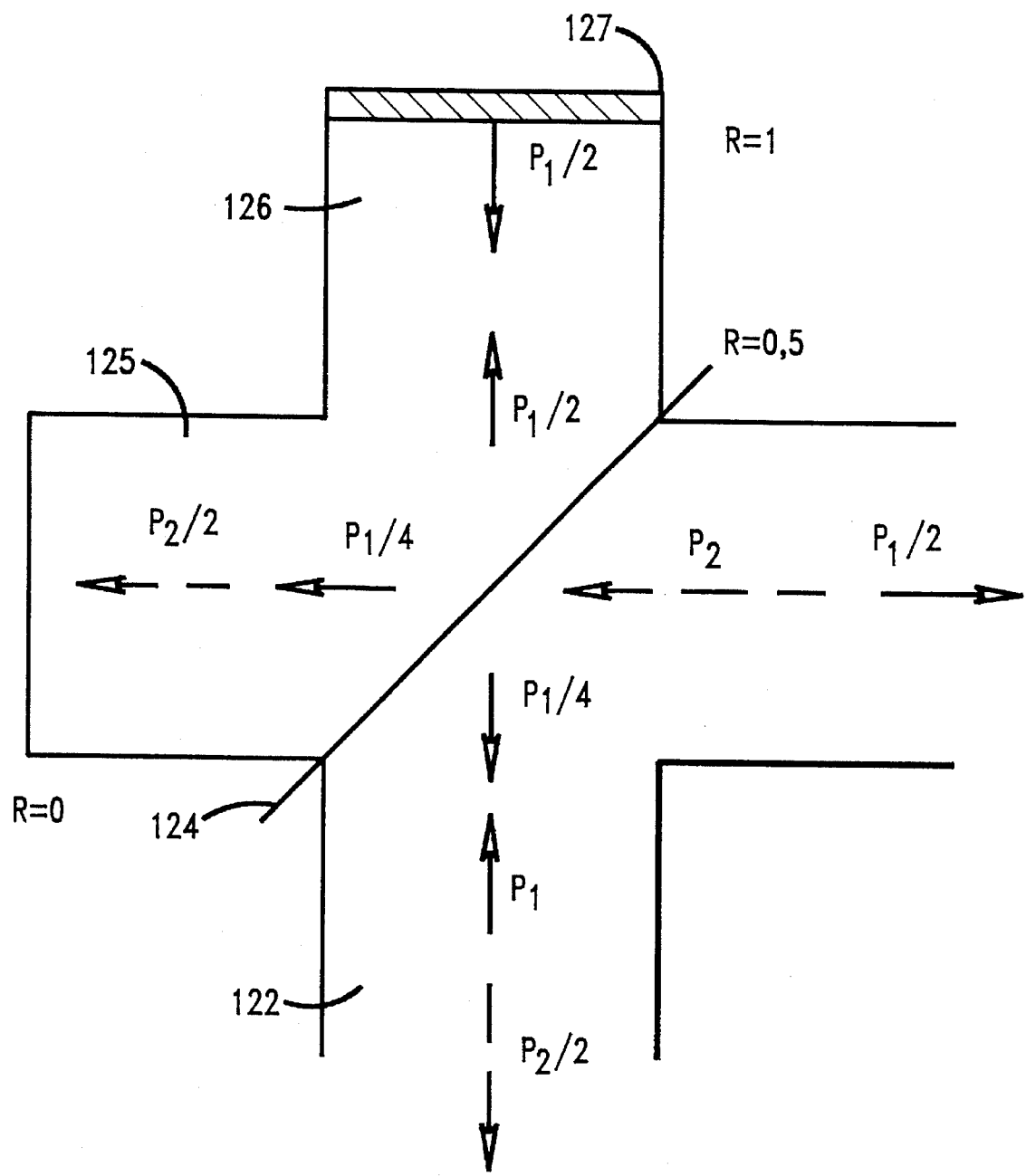

FIG. 12 shows a detailed sketch of the laser diode of FIG. 11.

Figure 13:
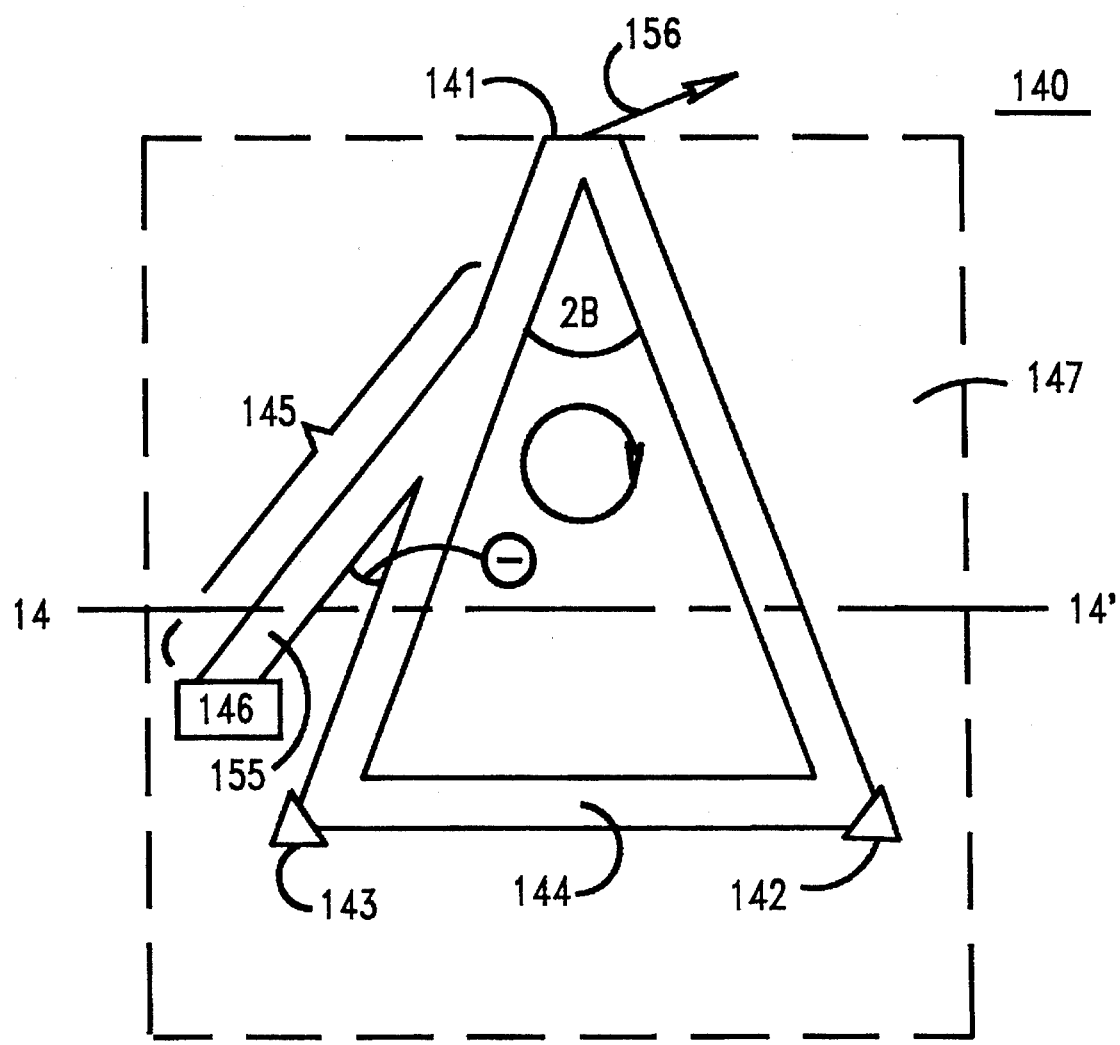

FIG. 13 shows a top view of a triangular shaped ring laser diode with integrated optical waveguide isolator in accordance with the fourth embodiment of the present invention.

Figure 14:
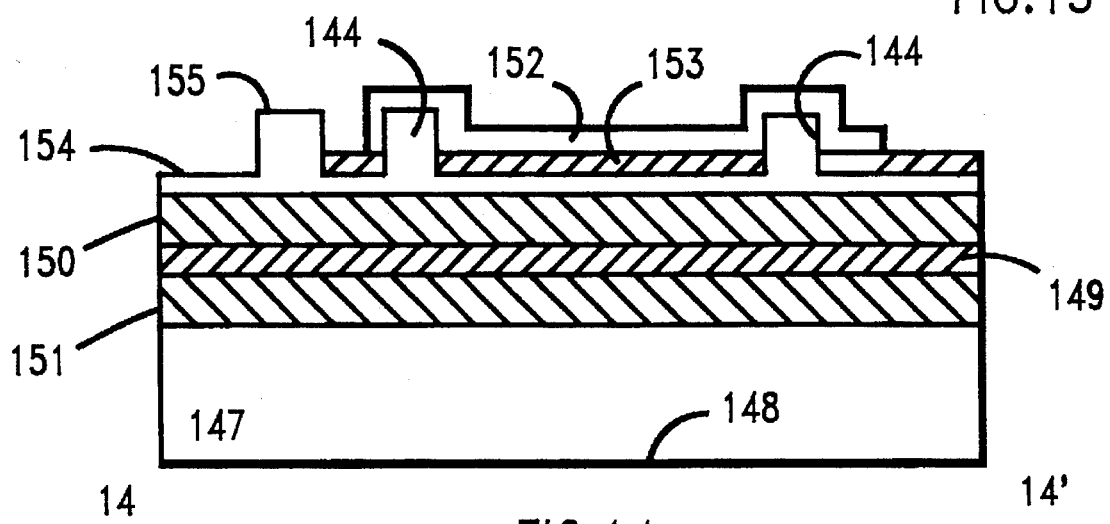

FIG. 14 shows a cross sectional view of the ring laser diode of FIG. 13, parallel to A—A'.

Figure 15:
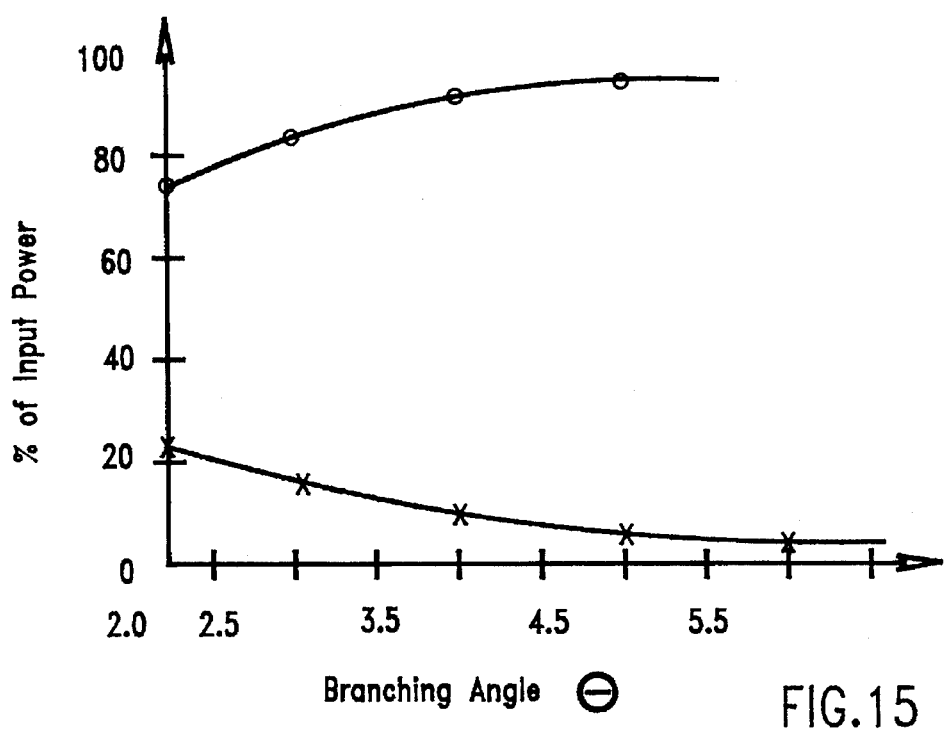

FIG. 15 shows the power of the un-attenuated (bullets) and the attenuated (crosses) light waves as function of tile branching angle $\theta$.

Figure 16:
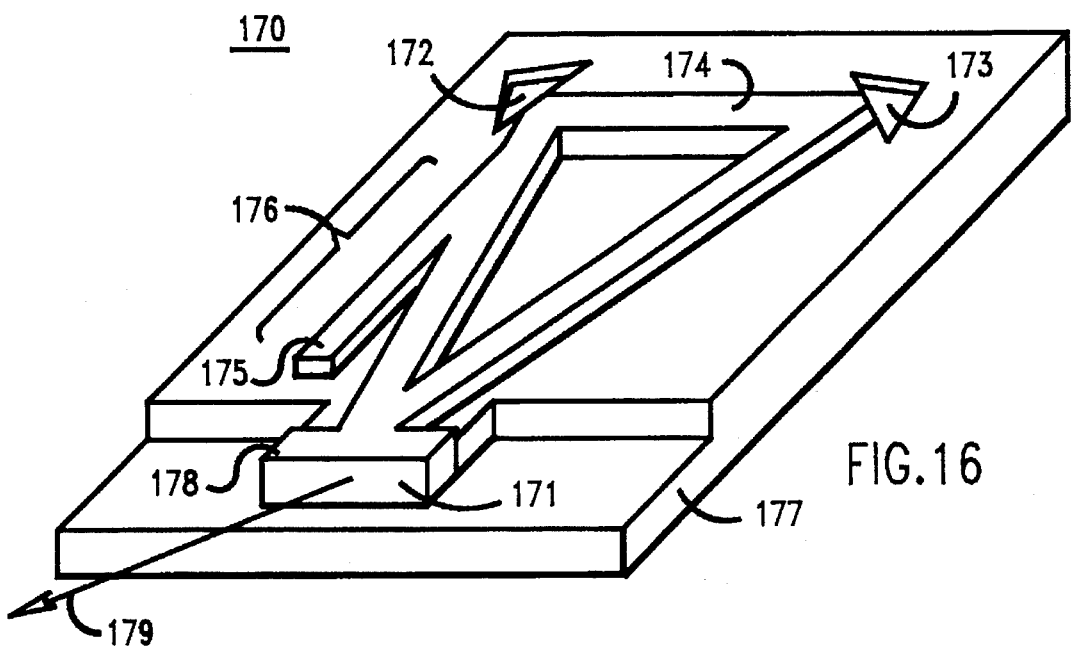

FIG. 16 shows a perspective top view of a triangular shaped ring laser diode with integrated optical waveguide isolator in accordance with the fifth embodiment of the present invention.

GENERAL DESCRIPTION

Before describing different embodiments of the present invention, the fundamental elements thereof are described separately. For simplicity reasons the herein described optical waveguide isolators are shown as being integrated on a substrate. Further embodiments are conceivable comprising optical fibers instead of waveguides integrated on a substrate, said fibers being splitted forming a branching waveguide coupler. From this point of view, the word waveguide is herein used as a synonym for channels, fibers, guides etc. suitable for guiding electro-magnetic waves such as light waves. Applications of the present invention are not limited to visible light waves.

First, some different types of optical channel waveguides are described in connection with FIGS. 1A–1H. These channel waveguides are well known in the art and are usually employed in various active and passive devices of integrated optics, including laser diodes, modulators, switches and directional couplers. The following section gives an overview of channel guide geometries, and the respective materials, which can be employed in an optical waveguide isolator in accordance with the present invention.

Figure 1A:
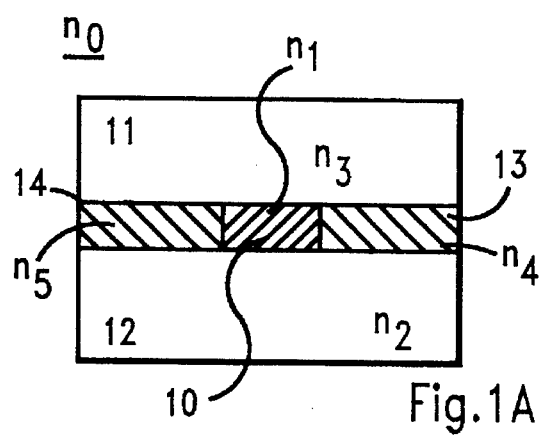
FIGS. 1 shows typical cross-sections of channel waveguide structures.

For simplicity, FIGS. 1A–1H show abrupt transitions of the refractive index. However, it should be clear that fabrication techniques such as diffusion may produce structures having guide cross sections with graded-index profiles. Compositional and/or carrier concentration variations can be used to provide lateral as well as vertical confinement in these structures. In all eight examples the light is essentially confined to the film material with refractive index $n_1$. The substrate's refractive index, denoted by $n_2$, is smaller than $n_1$, and the refractive index $n_0$ of the surrounding medium (free space) is smaller than $n_2$ ($n_1 > n_2 > n_0$). FIG. 1A shows a general channel waveguide, consisting of a buried channel 10 embedded between an upper layer 11, a substrate 12, and lateral layers 13, 14. The refractive indices, $n_4$ and $n_5$, of these lateral layers 13, 14 differ from the substrate's and upper layer's indices in many cases.

Figure 1B:
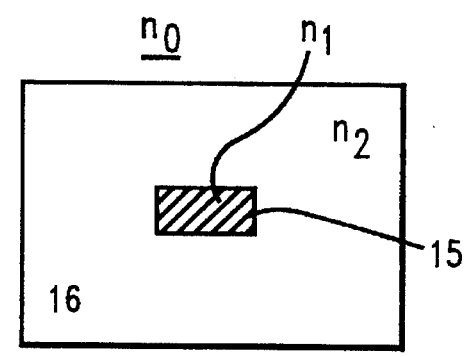
Figure 1C:
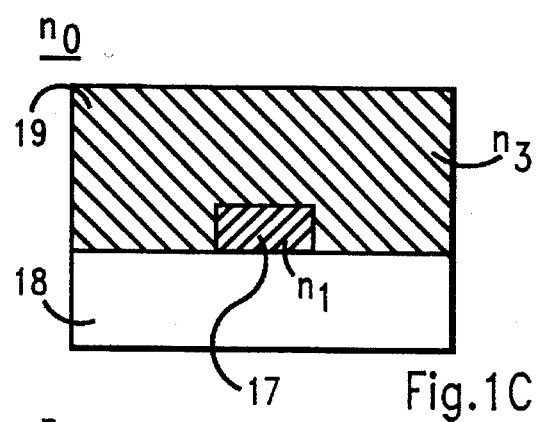
Figure 1D:
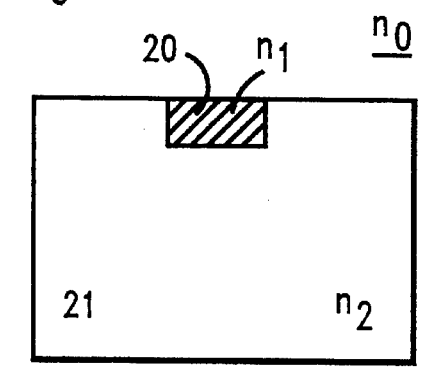

A channel waveguide 15 with refractive index $n_1$, being buried in a substrate 16, is illustrated in FIG. 1B. This channel waveguide 15 f.e. may consist of GaAs, whereas said substrate 16 consists of $Al_xGa_{1-x}As$. Another buried waveguide structure, shown in FIG. 1C, is characterized in that it comprises a GaAs channel waveguide 17 which is grown on top of an $Al_{xGa1-x}As$ substrate 18 and covered by an $Al_yGa_{f-y}As$ cap layer 19. The refractive index of this cap layer 19, depicted as $n_3$, is smaller than $n_1$ and larger than $n_0$ ($n_1 > n_3 > n_0$). A further waveguide structure, called strip waveguide structure, consisting of an embedded waveguide 20 and a substrate 21, is given in FIG. 1D. Its waveguide 20 may consist of InP being embedded in a GaInAsP substrate 21.

Figure 1E:
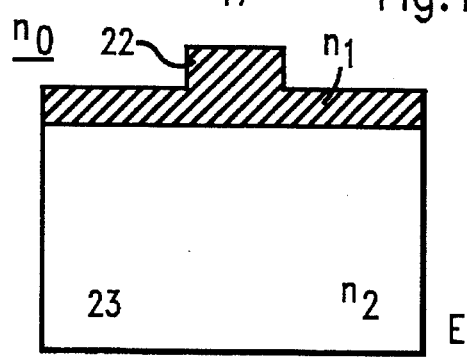
Figure 1F:
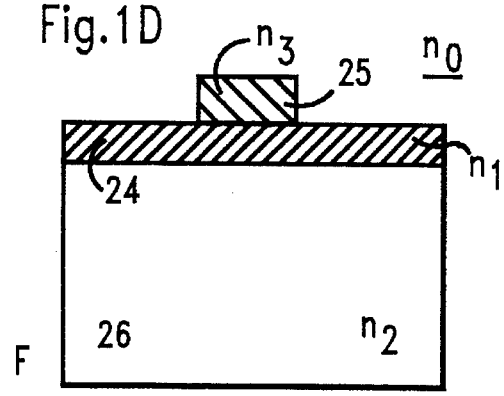
Figure 1G:
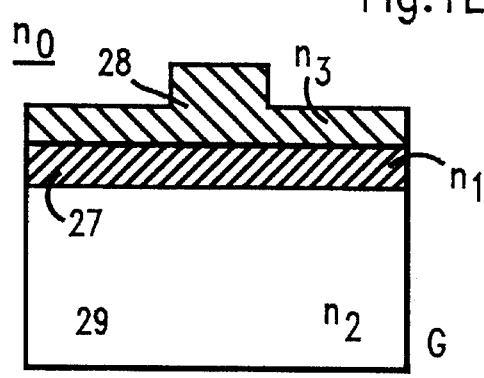
Figure 1H:
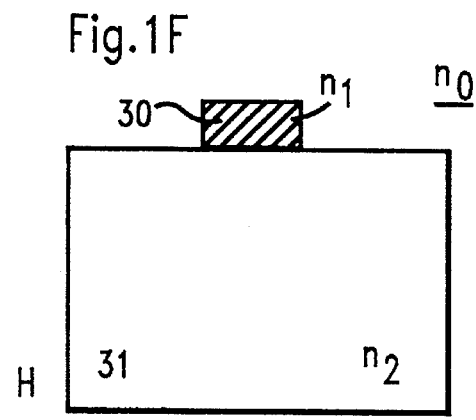

The rib waveguide structure of FIG. 1E, comprises an upper layer 22 with refractive index $n_1$ deposited on top of a substrate 23, and being etched such that it forms a rib. A typical rib waveguide structure, as shown in FIG. 1E, consists of an $n^-$-GaAs waveguide 22 and an $n^+$-GaAs substrate 23. Two ridge waveguide structures are illustrated in FIGS. 1F and 1G. These structures are also known as dielectric-loaded waveguide structures consisting of waveguide layers 24 and 27, grown on substrates 26, 29, and being at least partly covered by cap layers 25, 28. Exemplary materials are: $p^+$-AlGaAs cap layers 25, 28; $n^-$-GaAs waveguide layers 24, 27; $n^+$-GaAs substrates 26 and 29. Another, very simple structure, referred to as raised strip waveguide structure, consists of a strip waveguide 30 being formed on top of a substrate 31. Said raised strip waveguide structure is illustrated in FIG. 1H.

It should be stressed that these structures are only examples. Different techniques for making the same, and different materials to be used are known in the art. Commonly used materials are GaAs, AlGaAs, GaInAsP, and InP. Depending on the waveguide's geometry, in particular its width, a waveguide is suited for guiding single-mode or multi-mode light waves. Additionally, the surrounding media, f.e. the lateral layers, allow either strong or weak guiding of a light wave.

In the following, some basic branching waveguide structures are described. The distinguishing characteristics of optical branching waveguide structures are that the evanescent fields of the guided modes exist outside the boundaries of the guiding layers or channels, and power transfer between the branches can occur due to the overlap of the evanescent fields. Yajima showed in his article "Dielectric Thin Film Optical Branching Waveguide", Applied Physics Letters, Vol. 22, No. 12, June 1973, pp. 647–649, that modes incident on an asymmetric planar-dielectric branching waveguide with a shallow taper, propagate such that the mode power is transferred to one arm of the branch or the other. The principle was established that a mode chooses the arm in which it could propagate with an effective index closest to the effective index that characterized its propagation before the waveguide divided. An asymmetric branching waveguide with a shallow taper can thus be considered to act as a mode splitter. Yajima further described, that branching waveguides with steeper tapers behave as ideal mode splitters clue to mode conversion between the normal modes and power transfer to unguided radiation modes. Symmetry considerations lead to the extreme cases of steep tapers or near-symmetric branches. These branching waveguides do not act as mode splitters, but as power dividers.

An asymmetric branching waveguide coupler, consisting of two branches 41, 42 and a stem 40, is shown in FIG. 2A. The taper angle θ is defined as being the angle between the two branches 41 and 42. More detailed asymmetric branching waveguide structures are described in "Mode Conversion in Planar-Dielectric Separating Waveguides", W. K. Burns et al., IEEE Journal of Quantum Electronics, Vol. QE-11, No. 1, January 1975, pp. 32–39.

A symmetric branching waveguide coupler, illustrated in FIG. 2B, is characterized by two branches 44, 45 symmetrically branching a waveguide stem 43. Typical symmetric branching waveguides are described in "Normalised Power Transmission in Single Mode Optical Branching Waveguides", H. Sasaki et al., Electronics Letters, Vol. 17, No. 3, February 1981, pp. 136–138. Two branching waveguide couplers, shown in FIGS. 2C and 2D, with tapered waveguide sections 47 and 51, respectively, are characterized by these tapered sections providing for an adiabatic transition from the waveguide stems 46 and 50 to the respective branches 48, 49, and 52, 53. The aperture angle α of these tapered sections can be smaller, equal, or larger than tile branching angle θ/2. These kind of branching waveguide couplers with tapered section are reported on in "Operation Mechanism of the Single-Mode Optical-Waveguide Y Junction" M. Izutsu et al., Optics Letters, Vol. 7, No. 3, March 1982, pp. 136–138.

The first embodiment of the present invention is described in connection with FIG. 3. As can be seen from FIG. 3, this optical isolator 121 comprises an asymmetrical multimode branching waveguide coupler 56 with tapered waveguide section 55, which has an aperture angle α. The first branch of the branching waveguide coupler 56, depicted by reference numeral 57, is connected to an optical absorber means 54. The end of the second branch 58 is coupled to the optical isolator's input pod 95. The third end of the branching waveguide coupler 56, i.e. the end of the waveguide stem 60, is coupled to the output pod 96 of the isolator 121. As illustrated in FIG. 3, all elements of this embodiment are integrated on the same substrate 59.

A light wave with power $P_0$, fed to the optical isolator's input pod 95, is guided via said second branch 58, the tapered section 56, and the waveguide stem 60 to the output pod 96. A light wave, travelling from the input port 95 to the output pod 96, is only slightly attenuated by the second branch intersecting at the branching point. The losses at this point are about 3 dB. A light wave, with power $P_1$, coupled to the output pod 96 of the optical isolator, thus travelling in the opposite direction of a light wave fed to the input port 95, is guided along the waveguide stem 60 most of its power being transferred into the first branch 57. Optical absorber means 54 are attached to this branch 57 to ensure that no back reflection occurs. Guiding this counter-propagating light wave to the absorber means 54 ensures that only a small amount of light is guided along branch 58 to the input 95. The said tapered waveguide section 55 has been inserted between the waveguide stem 60 and the two branches 57, 58, to provide for a slow adiabatic transition. Such a slow adiabatic transition is defined as a transition between the stem and the branches that takes place gradually with propagation distance z so that negligible power transfer occurs between the normal modes, as they propagate from the stem 60 into the first branch 57 or from the second branch 58 into the stem 60. If the aperture angle α of this tapered section 55 is small enough, power injected initially in a given local normal mode will stay in that mode throughout the transition from the stem 60 into branch 57 and from the second branch 58 into the stem 60.

A second embodiment of the present invention is shown in FIGS. 4, 5, 6A and 6B. This embodiment, hereinafter referred to as opto-electronic integrated circuit 61, comprises an optical waveguide isolator being monolithically integrated on a substrate with a ridge waveguide laser diode 63. The optical waveguide isolator consists of a branching waveguide coupler 62, the first branch 69 thereof being coupled to an optical absorber means 64 and the second branch 67 being optically linked to the facet 78 of said laser diode 63. The end of the waveguide stein 68 is butt-coupled to an optical fiber 65 which is aligned and fixed in a V-shaped groove 66. A simplified cross sectional view, cutting the two waveguide branches 67 and 69 parallel to the line A—A', is illustrated in FIG. 5. As can be seen from this Figure, the waveguide structure, providing for optical confinement and guidance of light waves, comprises a waveguide layer 71, with refractive index $n_1$, being embedded between upper and lower cladding layers 79 and 80, respectively. The substrate 70, on which these layers are grown, is structured such that ridge waveguide channels 67 and 69 are formed.

Optical absorber means 64 can be realized for example by Zn ion bombardment of a portion of a waveguide, thus providing for a decreased bandgap in this portion. This bombardment locally narrows the bandgap and increases the absorption. The size, shape and position of the absorber means can be defined by deposition of a mask with suitable window prior to the ion bombardment. The influence of Zn ions introduced into AlGaAs is described in "High Optical Power Density Emission from a 'Window-Stripe' AlGaAs Double-Heterostructure Laser", H. Yonezu et al., Applied Physics Letters. Vol. 34, No. 10, May 1979, pp. 637–639. Instead of a highly doped region, a grating coupler or 45 degree reflecting surface may serve as absorber means by reflecting the light wave out of the waveguide. Or, for instance, a roughened waveguide surface can be employed for diffusion of a light wave travelling through the waveguide and thus serving as optical absorber means which receives a light wave without reflecting it back.

The herein employed principle for coupling and aligning the ridge waveguide laser diode 63 to the second waveguide branch 67, is schematically illustrated in FIGS. 6A and 6B, FIG. 6B showing a detailed and magnified sketch of FIG. 6A. The laser diode 63, consisting of an active layer 75, sandwiched between an upper cladding layer 76 and a lower cladding layer 77, is grown on top of a structured substrate 70. A ridge 81 has been defined on this substrate 70 prior to the deposition of the laser's and waveguide's layers 75–77 and 79, 80 and 71. The growth of these layers on top of the structured substrate 70, guarantees proper alignment of the waveguide core layer 71 and the active layer 75 of the laser 63. The laser diode 63 further comprises insulation layers 74 covering the upper cladding layer 76 and providing for a contact window to the ridge 72 of the laser 63. A metallization layer 73 is deposited on top of this structure, as illustrated in FIG. 6A, contacting said ridge of the laser diode 63. The light emitting portion 82, indicated as an ellipsoide area in FIG. 6B, of the laser diode 63 is aligned to the waveguide layer 71, for efficient coupling the light wave emitted by the laser 63 into the waveguide branch 67. More details of the alignment of laser diodes and waveguides are for example described in:

European Patent application EP-A 0 402 556 with title "A Method for Improving the Flatness of Etched Mirror Facets";

European Patent application, Application number 91810742.6, with title "Self-Aligned Optical Waveguide to Laser Structure and Method for Making the Same";

"High Performance Buried Ridge DFB Lasers Monolithically Integrated With Butt Coupled Strip Loaded Passive Waveguides for OEIC", P. J. Williams, Electronics Letters, Vol. 26, No. 2, January 1990, pp. 142–143.

The third embodiment of the present invention, an optical two-stage waveguide isolator consisting of two branching waveguide couplers 83 and 84, is schematically and simplified shown in FIG. 7. This isolator has an input port 85 coupled to the first waveguide branch 89 of the first stage coupler 83, and an output port 86 situated at the waveguide stem 92 of the second stage branching waveguide coupler 84. The waveguide stem 91 of the first waveguide coupler 83 is connected to the first branch 93 of the second branching waveguide coupler 84, the second branch 94 of this coupler 84 being linked to a second optical absorber 88. Similar to this, the second branch waveguide 90, of the first stage branching waveguide coupler 83, is coupled to a first absorber 87. The present optical isolator is grown on top of a GaAs substrate, the ridge waveguides having a width of 3 μm. These 3 μm ridge waveguides allow two propagating TE-modes and the power inside a single propagating mode is not conserved in the branching waveguide coupler, i.e. if a $TE_0$-mode enters the branching coupler the forward transmitted power will be in the $TE_1$- as well as in the $TE_0$-mode. However, this is not relevant for multimode (MM) fiber/waveguide optical systems. Typical branching angles $\theta_1$ and $\theta_2$ are between 1 and 5 degrees. This arrangement of two branching waveguide couplers 83, 84, and optical absorber means 87 and 88, provides for an efficient optical waveguide isolator guiding a light wave from the input port 85 to the output port 86 with low loss. A counter-propagating light wave. i.e. a light wave fed into the optical isolator via output port 86, is attenuated such that only a small amount thereof is transmitted to the input port 85.

The dependence of the forward coupling efficiency, i.e. the coupling efficiency from the input port 85 to the output port 86, on branching angle θ is shown in FIG. 8. These measurements and calculations are based on a rib waveguide structure with the following effective refractive indices: $n_{1,eff}=3.4186$ and $n_{2,eff}=3.4267$ and a rib width of 3 μm. These effective indices can be determined by reduction of the three-dimensional waveguide structure to a two-dimensional structure and concurrent effective index approximation. The backward efficiency, between output port 86 and input port 85, is shown in FIG. 9. Using the data from FIGS. 8 and 9, such a two-stage optical waveguide isolator with a forward coupling efficiency of about 50% has a coupling efficiency of less than 10% in the reverse direction. Defining the isolator strength as the ratio between forward and backward coupling efficiencies, the present optical isolator has an isolator strength of about 4–5, with branching angles $\theta_1$ and $\theta_2$ between 2 and 3 degrees.

Much larger isolating effects, with still sufficient coupling efficiency in forward direction, can be achieved by putting several branching waveguide couplers in series, thus forming multi-stage optical waveguide isolators. Considering a 4-stage multi-branching optical isolator with multimode waveguides and branching angles θ of 2°, the forward coupling efficiency is still 41%, but the backward coupling efficiency now is reduced to only 0.16%. Hence the isolator strength is about 256. A 4-stage multi-branching optical waveguide isolator with 3° branching angles θ would give an isolator strength of even 625.

The next embodiment of the present invention relates to an optical waveguide isolator being inserted into the ring cavity of a semiconductor ring laser diode.

Ring laser cavity configurations are well known means providing for single-frequency laser beams. These configurations, e.g. consisting of a Brewster-ended Nd:YAG laser rod situated in tile light path of a triangular or rectangular cavity and a Faraday cell in combination with a λ/2 plate, are very complex optical assemblies. The above outlined ring laser is described in the already mentioned article "Single-Frequency Traveling-Wave Nd:YAG Laser", A. R. Clobes et al., Applied Physics Letters, Vol. 21, No. 6, September 1972, pp. 265–266. The disadvantages, such as cost, size, sensitivity, and the critical alignment of these kind of configurations, built up using individual optical components, are obvious.

Recent developments in semiconductor technology allow the integration of ring laser diodes on semiconductor substrates, thus reducing size, cost and most of the alignment problems of the assemblies described above. The major step towards integration of ring laser diodes on semiconductor substrates has been made possible by successful investigations on Fabry-Perot semiconductor laser diodes with etched facets, as for example reported on in "Full Wafer Technology-A New Approach to Large-Scale Laser Fabrication and Integration", P. Vettiger et al., IEEE Journal of Quantum Electronics, Vol. 27, 1991.

The first etched facet ring laser diode with output coupling has been disclosed in "Etched-Facet AlGaAs Triangular-Shaped Ring Lasers With Output Coupling", A. Behfar-Rad et al., Applied Physics Letters. Vol. 59, No. 12, September 1991, pp. 1395–1397. This ring laser diode, as schematically illustrated in FIG. 10, comprises a triangular shaped optical multimode waveguide 100, forming a cavity with two totally and one partially reflecting etched facets 101,102, and 103, respectively. Two counter-circulating multimode light waves 104, 105 travel through said waveguide being totally reflected by end-facets 101 and 102, and partially coupled out of the cavity at the front facet 103. The total cavity length, shown as dashed line, of this ring laser is about 600 μm, the width of the waveguide 100 about 40 μm. Disadvantages of this structure are its multimode output and modal instability. Another disadvantage is caused by the fact that both counter-propagating light waves 104 and 105 are deflected out of the cavity 100 with diverging directions, as indicated by arrows 106 and 107, depending on the refractive index of the cavity 100 and the surrounding medium (Snellius's law).

Another semiconductor ring laser diode is described in the Japanese patent application, JP-A 3-40480, with Application No. 64-176047 and title "Semiconductor Ring Diode". The light extradion efficiency of a rectangular ring laser diode has been improved by additional means introduced into the light path, as shown in FIG. 11. This rectangular ring laser diode 120, consists of a waveguide cavity 122 with three totally reflecting etched mirrors 123 and a fourth mirror 124 being partially reflecting. Said partially reflecting mirror 124 is situated such that part of a clockwise rotating light wave is coupled out of the cavity 122, another part being coupled back into the cavity 122, now circulating counter-clockwise.

A schematic sketch of the upper left corner of said cavity 122, said mirror 124 and the waveguide branches 125, 126 is shown in FIG. 12. For a more detailed explanation of the operation of this semiconductor ring diode 120, the partially reflecting mirror 124 is assumed to reflect 50% (R=0.5) of the incident light, both from the cavity side and from the other side. The totally reflecting layer 127, 100% of the incident light is reflected (R=1), and the interface between waveguide 125 and surrounding medium, having R=0, are assumed to be ideal. Based on these assumptions a simplified power estimation, as shown in FIG. 12, is possible. 50% of an incident, clockwise circulating light wave with power $P_1$ is reflected at mirror 124, with angle of incidence equal to angle of reflectance, i.e $P_1/2$. This portion $P_1/2$ continues to circulate in the clockwise direction. The second 50% of $P_1$ are transmitted through mirror 124 and reflected at totally reflecting mirror 127. 50% of this light wave with $P_1/2$ now being reflected at the other side of mirror 124, are coupled via waveguide branch 125 and its end facet out of the laser device. The power of this light wave is $P_1/4$.

A lightwave (dashed) with power $P_2$, counter-propagating in cavity 122, is partially reflected at mirror 124, 50% thereof ($P_2/2$) being reflected such that it continues to circulate counter-clockwise. The remaining 50% of the incident lightwave with power $P_2$ penetrates said mirror 124, without changing the direction of propagation, and are coupled out of the device ($P_2/2$).

The portion $P_1/4$ of the lightwave being coupled back into the cavity's waveguide 122 has a phase not being coupled to the phase of the light wave with power $P_2/2$ already being present in the cavity 122 and circulating in a counter-clockwise direction. The superposition of these lightwaves, having different modes and phases, has a detrimental influence on the laser's output spectrum which is not single mode and single-frequency. The phase shift between the lightwave which circulates counter-clockwise and the lightwave coupled back into the cavity is not constant because the different cavity lengths, with and without branch waveguide 126, provide for a shift of the light wave coupled out of the cavity with respect to the wave remaining in said ring. This displacement of phases results in an instability and variation of the output power in the output waveguide 125. The modal behavior and phase relation of both lightwaves superposed in output branch 125, depend on the modal behavior and phase displacement of the two counter-propagating light waves in the cavity 122. These counter-circulating waves are usually independent of each other such that the emitted light beam, indicated as arrow 128, is a multi-frequency and multi-mode light wave.

The fourth embodiment of the present invention is described in context with FIGS. 13 and 14.

Almost any Fabry-Perot laser diode known in the ad can be modified such that a light wave, generated in the active region when applying a certain threshold current, can be optically confined and guided in a ring shaped waveguide cavity instead of the conventional Fabry-Perot rectangular cavity. Similar to said Fabry-Perot lasers, the optical confinement, in particular the lateral confinement, depends on the shape and type of waveguide. Furthermore, the type of active region employed has an influence on the optical confinement. Different materials, such as III-V and II-VI compound semiconductors already used in conventional, herein referred to as Fabry-Perot laser diodes are suitable for the implementation of ring lasers. The basic structure of a ring laser diode may be either a SCH (Separate Confinement Heterostructure), DH (Double Heterostructure), GRIN-SCH (Graded Refractive Index Separate Confirmament Heterostructure), DCH (Decoupled Confinement Heterostructure), QW (Quantum Well) structure, or MQW (Multi-Quantum Well) structure, just to mention some of the different structures known. These structures are more detailed described in books dealing with fundamentals of semiconductor laser diodes such as for example "Physics of Semiconductor Devices", S. M Sze, 2nd Edition, John Wiley & Sons, New York, 1981. The above mentioned DCH laser diode, to date not published, is object of the pending European patent application EP 92810473.6.

Similar to Fabry-Perot laser diodes, the optical confinement can be achieved by employing an optical waveguide being situated adjacent to the laser's active region. Different types of optical waveguide structures, such as ridge waveguide, rib waveguide, step-index film waveguide, diffused channel waveguide, stripe-geometry waveguide, buried waveguide (BH), and stripe buried waveguide are known in the art, some being illustrated in FIGS. 1A through 1H.

The ring waveguide cavity of a ring waveguide laser diode has to be shaped such that light generated in the diode is confined in said cavity and circulates therein, guided by total reflection. Totally and partially reflecting mirrors are pad of said waveguide cavities to support multiple bouncing of the light waves similar to the parallel rear and front facets forming the cavity of a conventional a Fabry-Perot laser. The reflectivity of the partially reflecting front facet, through which the laser light is coupled out of the cavity, defines the power of laser light remaining inside the cavity.

The most important requirement, when designing a ring waveguide cavity, is to provide for a closed light path, employing totally reflecting mirrors, and a partially reflecting mirror coupling pad of the circulating light out of the cavity. The angle of incidence, at the partially reflecting mirror, has to be smaller than the critical angle to ensure transmission of the incident light beam through said mirror instead of total internal reflection.

The fourth embodiment of the present invention, is illustrated in FIGS. 13 and 14. FIG. 13 shows a schematic top view of a semiconductor laser diode 140 with triangular waveguide cavity. The total cavity length of these kind of ring lasers is typically between 300 and 1000 µm, the width of the waveguide ridges depending on the wavelength and transversal modes to be optically confined and guided. In the present embodiment, the total cavity length is about 600 µm and the width of the ridge is 3 µm. The waveguide cavity is defined by a ridge waveguide structure 144 grown on top of the stacked layers of a laser diode. Two mirror facets 142 and 143 are formed at the corners of the waveguide structure 144 by etching suitable grooves, as already shown in FIGS. 1 and 2 of the already mentioned Japanese patent application JP-A 3-40480. The front facet 141 of said ring laser 140 is formed by cleaving and serves as partially reflecting mirror. The angle of incidence at this front facet 141 is approximately equal to the angle β shown in FIG. 13. The reflectivity of front facet 141 depends on said angle β as reported in "Etched-Facet AlGaAs Triangular-Shaped Ring Lasers With Output Coupling", A. Behfar-Rad et al., Applied Physics Letters, Vol. 59, No. 12, September 1991, pp. 1395–1397. With increasing angle of incidence, the front facet becomes totally reflecting such that no light is coupled out of the ring cavity, as can be seen from a decrease in threshold current (FIG. 5 of A. Behfar-Rad et al.). The angle β should preferably be smaller than 25°.

An optical waveguide isolator, consisting of an asymmetrically branching waveguide coupler 145 and absorber means 146, is inserted into said waveguide ring 144, providing for attenuation of the counter-clockwise rotating light waves. An optical absorber means 146, e.g. being realized by a waveguide section in which no charge is injected, or by ion implantation decreasing the bandgap, is situated at the end of one branch of the branching waveguide coupler 145, such that most of the light coupled out of the triangular waveguide 144 is absorbed without reflecting it back into the clockwise rotating light wave. The power coupled out of said ring depends on the angle θ. The dependance of the power of the counter-clockwise circulating light wave after passing the branching waveguide coupler 145 and the power in the branching waveguide as functions of the branching angle θ is illustrated in FIG. 15 (bullets=% of input power of the counter-clockwise rotating light wave remaining in the ring after passing the branching point; crosses=% of the input power of the counter-clockwise rotating light wave coupled out of the ring). The power loss, defined as incident power minus power coupled out and power remaining in the counter-clockwise circulating mode, is about 3% of said incident power.

A cross-sectional view, along cut A—A' is illustrated in FIG. 14. As can be seen from this Figure, the laser diode 140 is formed on top of a substrate 147. The active region 149, e.g. comprising an active layer, a quantum well or multi-quantum well, is embedded between an upper and a lower cladding layer 150, 151 respectively. Ridges 144 and 155 are formed by etching cladding layer 154, situated on top of cladding layer 150. The waveguide branches of said triangular waveguide ring 144 are embedded by an insulation layer 153 such that a metallization 152 provides for a contact to said ridge 144, only. The bottom contact metallization 148 is applied to the substrate 147. The waveguide ridge 155 of the branching waveguide coupler 145 is not covered by said metallization 152 such that no lasing action occurs in the portion of the active layer 149 situated underneath. Waveguide branch 155 is highly absorbing light coupled into it, because there is no charge injected into it.

When applying a current being larger than the threshold current to said laser diode's contacts 148 and 152, lasing action occurs within the cavity 144. The clockwise rotating light wave travels nearly un-attenuated, whereas a counter-circulating light wave is attenuated such that it is more and more suppressed. By suppressing the counter-clockwise rotating wave, all energy is transferred into the clockwise rotating light wave. The suppression of the counter-clockwise circulating light wave by tile optical waveguide isolator corresponds to high losses for this light wave and therefore requires a much higher gain for lasing than for the counter-propagating wave. This counter-propagating light wave, which remains in the cavity 144, is partially coupled out at the front facet 141, as indicated by arrow 156.

The threshold current density of the present laser with incidence angles near the critical angle, i.e. 25°, is lower compared to a similar Fabry-Perot laser, indicating lower overall cavity loss and higher quantum efficiency. The laser's efficiency is further improved by eliminating one of the counter-circulating light waves, in the present embodiment the counter-clockwise rotating one. The light output of the above described triangular ring laser diode is almost single frequency. The employment of optical absorber means 146, in addition to the already absorbing waveguide branch 155, prevents that said light beam removed from the ring is reflected and coupled back into the counter-rotating light wave. This would have a detrimental influence on the un-attenuated beam, because there is no fixed phase relation between the counter-rotating beams. The phase shift varies such that a reflected light wave would interfere with the un-attenuated light wave reducing the spectral purity of the output beam. The optical absorber means 146 can be omitted.

Another embodiment of the present invention is described in context with FIG. 16 showing a perspective view of a triangular ring laser 170. This laser diode 170 is characterized in that it has three etched mirror facets 171–173, and a triangular shaped ridge waveguide cavity 174 with flared end-section 178 near the front facet 171. This waveguide, in combination with the mirror facets 171–173, provides for lateral optical confinement thus defining a ring laser cavity. The flared end-section 178 is employed to improve the flatness of the front facet 171 which has to be partially reflecting and of high quality. More details on etched mirror facets in general and facets with improved flatness are reported on in the European patent applications EP-A 0 363 547 and EP-A 0 402 556, respectively. Similar to the fourth embodiment, an optical waveguide isolator 176 is integrated on the same substrate 177 providing for an attenuation of the counter-clockwise rotating light wave. The herein employed optical isolator 176 comprises a branching waveguide coupler whose branch 175 is strongly absorbing light waves coupled into it. The portion of this branch 175, providing for the absorption of light waves, serves as absorber means, thus requiring no additional optical absorber means attached to its end. To further improve the elimination of the counter-clockwise rotating light wave, an optical absorber can be attached to the separate waveguide's end.

By suppressing one of said light waves, the clockwise rotating wave requires less gain for lasing than the attenuated wave resulting in a semiconductor ring laser diode with only one unidirectional circulating ring mode. This ring mode is partially coupled out of the ring at front facet 171, as indicated by reference numeral 179.

The rear facets 172 and 173 are formed by etching grooves, not necessarily of triangular shape, such that nearly flat facets are achieved. All waveguide ridges are shown as ridges having a rectangular cross-section which is by no means necessarily so.

Other shapes of the waveguide cavities, e.g. pentagon shaped cavities, are conceivable.

We claim:

1. An Optical waveguide isolator (121) with an optical input port (95) and an output port (96) comprising:

optical absorber means (54) for receiving light without reflecting it, and an optical branching waveguide coupler (56) having a waveguide stem (60) being splitted at its first end into two waveguide branches (57,58), both arranged such that the second end of said waveguide stem (60) forms said optical output port (96), and a first of said two waveguide branches (58) forms said optical input port (95), said optical absorber means (54) either being an integral part of the second waveguide branch (57) or being attached to it, said first waveguide branch being at an angle θ to said waveguide stem such that most of a light wave travelling from said output port (96) in the waveguide stem (60), is coupled into said second waveguide branch (57) and guided to said optical absorber means (54), said optical absorber means ensuring that no back reflection occurs.

2. The optical waveguide isolator of claim 1, wherein said optical absorber means (54) and said branching waveguide coupler (56) are integrated on a common substrate (59).

3. The optical waveguide isolator (121) of claim 1, wherein said branching waveguide coupler (56) is an asymmetric branching waveguide coupler, the main axis of the second waveguide branch (57) thereof being approximately parallel to the main axis of its waveguide stem (60), and the first waveguide branch (58) splitting the waveguide stem (60) with a branching angle θ.

4. The optical waveguide isolator of claim 1, wherein said waveguides are multi-mode waveguides.

5. The optical waveguide isolator (121) of claim 2, wherein a tapered waveguide section (55) with taper angle α is situated between said waveguide stem (60) and the two waveguide branches (57, 58), providing for an adiabatic transition from the stem (60) to the branches (57, 58) and vice versa.

6. The optical waveguide isolator of claim , wherein the taper angle α is smaller than half of the branching angle (θ).

7. The optical waveguide isolator of claim 1, wherein light waves are weakly guided in said waveguides.

8. The optical waveguide isolator of claim 1, wherein said branching angle θ is less than 10°.

9. The optical waveguide isolator (61) of claim 2, wherein a light emitting diode, in particular a laser diode (63), is integrated on said substrate and directly coupled to said input port, such that a light wave emitted by said light emitting diode is coupled via said first waveguide branch (67) and the waveguide stem (68) out of the isolator (61), a light wave being reflected back into the isolator (61) via said output port being coupled into the second waveguide branch (69).

10. The optical waveguide isolator according to claim 2, wherein semiconductor ring laser diode (140) is integrated on said substrate (147).

11. An optical waveguide isolator (121) with optical input port (95) and output port (96) comprising:

at least two branching waveguide couplers, each said waveguide coupler comprising:

optical absorber means (54), and an optical branching waveguide coupler (56) having a waveguide stem (60) being split at its first end into two waveguide branches (57,58), both arranged such that the second end of said waveguide stem (60) forms said optical output port (96), and a first of said two waveguide branches (58) forms said optical input port (95), said optical absorber means (54) either being an integral part of the second waveguide branch

(57) or being attached to it, the branching angle θ between the two waveguide branches (57, 58) being such that most of a light wave fed via said output port (96) into the waveguide stem (60) is coupled into said second waveguide branch (57) and guided to said optical absorber means (54); and said at least two branching waveguide couplers (83, 84) arranged such that the waveguide stem (91) of a first said coupler (83) is coupled to a first branch (93) of a second said coupler (84), an output port (86) being situated at the second waveguide coupler' stem (92), and the input port (85) at the end of the first branch (89) of the first coupler (83), optical absorber means (87, 88) being attached to the second waveguide branches (90, 94) of the two waveguide couplers (83, 83), respectively.

12. An optical waveguide isolator (121) with an optical input port (95) and an output port (96) said optical waveguide isolator comprising:

optical absorber means (54), integrated on a semiconductor substrate, a ring laser diode (140) integrated on said substrate comprising an active region (149) and a waveguide ring cavity (144) providing for optical confinement, situated such that laser action takes place in said cavity when driving said laser diode (140) with a current, and an optical branching waveguide coupler (56) having a waveguide stem (60) being split at its first end into at least two waveguide branches (57, 58), said branching waveguide coupler (145) being integrated in said laser diode (140) such that either the counter-clockwise or the clockwise circulating light waves are coupled out of said waveguide ring cavity (144), said optical absorber means and said optical branching waveguide coupler being arranged such that the second end of said waveguide stem (60) forms said optical output port (96), and a first of said two waveguide branches (58) forms said optical input port (95), said optical absorber means (54) either being an integral part of the second waveguide branch (57) or being attached to it, the branching angle θ between the two waveguide branches (57, 58) being such that most of a light wave fed via said output port (96) into the waveguide stem (60) is coupled into said second waveguide branch (57) and guided to said optical absorber means (54).

13. The optical waveguide isolator of claim 12, wherein said waveguide ring cavity (144) has etched mirror facets (141–143), one mirror facet (141) being partially reflecting, the remaining facets (142, 143) being totally reflecting.

14. The optical waveguide isolator of claim 12, wherein the waveguide stem and a first of said waveguide branches are inserted into said waveguide ring cavity, the second waveguide branch branching the waveguide stem with a branching angle θ, preferably $0.1°<θ<2°$.

15. The optical waveguide isolator of any of the claim 12, wherein said waveguide ring is triangular shaped, having two totally reflecting rear facets (142, 143; 172, 173) and one partially reflecting front facet (141; 171).

16. The optical waveguide isolator of claim 15, wherein the waveguide ring is designed such that the angle of incidence $n_1$ said front facet is smaller than 25°.

17. The optical waveguide isolator of any of the claim 12, wherein optical absorber means (146) are attached to the second branch of said branching waveguide coupler (145) providing for a reduced back reflection of incident light waves.

* * * * *